United States Patent
Hsu et al.

(10) Patent No.: US 7,341,934 B2
(45) Date of Patent: Mar. 11, 2008

(54) METHOD FOR FABRICATING CONDUCTIVE BUMP OF CIRCUIT BOARD

(75) Inventors: Shih-Ping Hsu, Hsin-chu (TW); Sao-Hsia Tang, Hsin-chu (TW); Ying-Tung Wang, Hsin-chu (TW); Wen-Hung Hu, Hsin-chu (TW); Chao-Wen Shih, Hsin-chu (TW); Meng-Da Chou, Hsin-chu (TW)

(73) Assignee: Phoenix Precision Technology Corporation, Hsin-chu (TW)

( * ) Notice: Subject to any disclaimer, the term of this patent is extended or adjusted under 35 U.S.C. 154(b) by 286 days.

(21) Appl. No.: 11/079,389

(22) Filed: Mar. 15, 2005

(65) Prior Publication Data

US 2006/0051952 A1 Mar. 9, 2006

(30) Foreign Application Priority Data

Sep. 9, 2004 (TW) ............................. 93127249 A

(51) Int. Cl.
*H01L 21/44* (2006.01)
(52) U.S. Cl. .............................. 438/613; 257/E23.069
(58) Field of Classification Search ................ 438/675, 438/613; 257/E23.069
See application file for complete search history.

(56) References Cited

U.S. PATENT DOCUMENTS 6,828,510 B1 * 12/2004 Asai et al. ................... 174/255

* cited by examiner

*Primary Examiner*—Howard Weiss
(74) *Attorney, Agent, or Firm*—William F. Nixon; Clark & Brody

(57) ABSTRACT

A method for fabricating conductive bumps of a circuit board is proposed. First of all, a circuit board having a first surface and a corresponding second surface is provided. A circuit structure having a plurality of conductive pads is formed on each of the first surface and the second surface, and conductive structures are formed in the circuit board for electrically connecting the circuit structures. Also, an insulating layer having a plurality of openings penetrating therethrough is formed on the circuit board for exposing the conductive pad. Then, a conductive layer is formed on a surface of the insulating layer having the opening formed on the first surface of the circuit board. An electroplating process is performed via the conductive layer and the conductive structure, such that a conductive bump is formed on the conductive pad located on the second surface of the circuit board. Subsequently, a resist layer is formed on the second surface of the circuit board to cover the conductive bump, and another resist layer having openings penetrating therethrough is formed on the first surface of the circuit board to expose the conductive pad. Finally, a conductive bump is formed on the conductive pad located on the first surface of the circuit board by an electroplating process. By such arrangement, the conductive bumps are successively formed on the first surface and the second surface of the circuit board.

15 Claims, 4 Drawing Sheets

METHOD FOR FABRICATING CONDUCTIVE BUMP OF CIRCUIT BOARD

FIELD OF THE INVENTION

The present invention relates to a method for fabricating a conductive bump structure of a circuit board, and more particularly, to a method for fabricating a conductive bump structure of input/output connections of a circuit board by an electroplating process.

BACKGROUND OF THE INVENTION

Referring to the current flip-chip technique, electrode pads are located on a surface of a semiconductor integrated circuit (IC) chip and a corresponding conductive pad is provided on a circuit board. Solder bumps or other conductively adhesive materials are mounted on an active surface of the chip, which is provided on the top of the circuit board, such that the solder bump or the conductively adhesive material can be used as input/output connections for electrically and mechanically connecting the chip to the circuit board.

Referring to FIG. 1 which demonstrates a flip chip device known in the prior-art, a plurality of metal bumps 11 is formed on an electrode pad 12 of a chip 13, and a plurality of solder bumps 14 made of solder materials is formed on a conductive pad 15 of a circuit board 16. Under a reflow-soldering temperature condition in which the solder bump 14 can be melted, the solder bump 14 is subject to a reflow-soldering process to make contact with a corresponding metal bump 11, so as to form a solder joint 17. Referring to a solder bump joint, a bottom cement material 18 such as underfill can be further filled in a gap between the chip and the circuit board, such that a thermal expansion difference existed between the chip 13 and the circuit board 16 can be prevented and a stress of the solder joint 17 can be reduced. Subsequently, solder balls 19 are mounted on the other surface of the circuit board 16, such that the circuit board 16 integrated with the chip 13 can be electrically connected to an external electronic device.

Recently, the solder material is deposited on the conductive pad located on an upper surface of the circuit board to form the solder bump and the solder ball is formed on the conductive pad located on a lower surface of the circuit board by stencil printing technology. Referring to FIG. 2, the currently used stencil printing technology mainly provides a circuit board 20 formed with a solder mask layer 21 such as green paint on a surface thereof, and a plurality of conductive pads 22 for forming locations of solder materials (not shown) such as solder pastes. Firstly, a stencil 23 having a plurality of grids 23a is provide on the circuit board 20. After coating the stencil 23 with the solder material, a roller 24 is repeatedly rolled on the stencil 23 or a spraying process is performed, such that the solder material is able to form a solder (not shown) on the conductive pad using the gird 23a of the stencil 23 after the removal of the stencil 23. Subsequently, under a reflow-soldering temperature condition in which the solder can be melted, the solder is subject to a reflow-soldering process to form a pre-soldering bump on the conductive pad of the circuit board. Furthermore, the stencil of the foregoing stencil printing technology is preferably a steel plate.

During practical operation, along with the blooming development of various portable products in the fields of communication, networking and computing, packages such as ball grid array (BGA), flip chip, chip size package (CSP) and multi chip module (MCM) which are characterized with a miniaturized integrated circuit (IC) area, a high density and multiple leads have become the mainstream of the packaging market. Highly effective chips such as a microprocessor, a chip set and a drawing chip are usually combined with the foregoing package to achieve an operating function of a higher speed. However, circuits on a circuit board and a dimension of a conductive pad must be miniaturized for such structures to be applied. When the dimension and pitches of the conductive pad are miniaturized, dimensions of openings formed penetrating through the stencil also need to be reduced. Thus, a cost of stencil fabrication cannot be reduced due to difficulties in performing mold opening of the stencil. Also, it is difficult to allow the solder material to pass through the opening of the stencil due to smallness of the opening.

Furthermore, referring to criteria on the production accuracy of the solder material, frequencies and cleanness of stencil printing have to be concerned in addition to a precise dimension of the stencil while performing the stencil printing technology. As the number of printings is increased, the solder material remained in a wall of the opening of the stencil is as well accumulated. Since the solder material is of a certain viscosity, the amount and shape of the solder material for performing next printing will be different from the specification if the solder material is previously accumulated. Therefore, the stencil has to be wiped out after performing a certain number of printings to ensure the cleanness of the stencil during practical operation, otherwise the shape and dimension of the solder material might be altered to cause an inconvenience as well as a decreased reliability in fabrication.

SUMMARY OF THE INVENTION

In light of the above prior-art drawbacks, a primary objective of the present invention is to provide a method for fabricating conductive bumps of a circuit board, in which the conductive bump of the circuit board is formed for electrically connecting an exterior by directly using an electroplating process.

Another objective of the present invention is to provide a method for fabricating conductive bumps of a circuit board, so as to simultaneously form pre-soldering bumps on an upper surface of the circuit board and solder balls on a lower surface of the circuit board.

Still another objective of the present invention is to provide a method for fabricating conductive bumps of a circuit board, by which prior-art drawbacks such as difficulties in mold opening and a cost increase caused when dimensions of openings of a stencil have to be reduced due to miniaturized dimensions of conductive pads and reduced pitches between conductive pads in stencil printing technology can be avoided. Furthermore, a fabrication bottleneck that solder materials are not allowed to pass through the opening of the stencil due to the smallness of the opening can be eliminated.

A further objective of the present invention is to provide a method for fabricating conductive bumps of a circuit board, by which an inconvenience and a decreased reliability in fabrication caused in prior-art stencil printing technology can be prevented. In the stencil printing technology, as the number of printings is increased, a solder material remained in a wall of an opening of a stencil is as well accumulated, so as to influence the amount and shape of the solder material for performing the next printing. Thus, the stencil has to be wiped out to ensure the cleanness after performing a number of printings. The method for fabricating a conductive bump of a circuit board proposed in the present invention is capable of eliminating the foregoing drawback.

In accordance with the foregoing and other objectives, the present invention proposes a method for fabricating conductive bumps of a circuit board. First of all, a circuit board having a first surface and a corresponding second surface is provided. A circuit structure having a plurality of conductive pads is formed on each of the first surface and the second surface, and conductive structures are formed in the circuit board for electrically connecting the circuit structures formed on the first surface and the second surface. Also, an insulating layer having a plurality of openings penetrating therethrough is formed on the circuit board for exposing the conductive pad. Then, a conductive layer is formed on a surface of the insulating layer having the opening deposited on the first surface. An electroplating process is performed via the conductive layer formed on the first surface of the circuit board and the conductive structure formed in the circuit board, such that a conductive bump is formed on the conductive pad located on the second surface of the circuit board. Subsequently, a resist layer is formed on the second surface of the circuit board to cover the conductive bump, and another resist layer having openings penetrating therethrough is formed on the first surface of the circuit board to expose the conductive pad. Finally, an electroplating process is performed on the circuit board, such that a conductive bump is formed on the conductive pad located on the first surface of the circuit board. Afterwards, the resist layer and the conductive layer covered by the resist layer can be removed. If the conductive bump is made of a solder material, a reflow-soldering process can be performed to subsequently form a pre-soldering bump on the conductive pad located on a surface of the circuit board and a solder ball on the conductive pad located on the other surface of the circuit board. Alternatively, the conductive bump can be a generally conductive metal bump which serves as electrical signal input/output connections for the circuit board.

According to the foregoing method for fabricating conductive bumps of a circuit board proposed in the present invention, the conductive layer serving as a current conductive path for a subsequent electroplating process is firstly formed on any surface of the circuit board. Then, the patterned resist layer is formed on the other surface of the circuit board, such that the conductive bump is formed on the conductive pad exposed from the patterned resist layer by an electroplating process via the conductive layer. Subsequently, another patterned resist layer is formed on the conductive layer, and the conductive bump is formed on the conductive pad covered by the conductive layer by an electroplating process. Therefore, the conductive bumps can be successively formed on the conductive pads located on different surfaces of the circuit board for electrically connecting the exterior. Furthermore, the present invention can employ an electroplating process in place of a prior-art printing method to form the conductive bump of the circuit board, so as to improve fabrication reliability.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

A method for fabricating conductive bumps of a circuit board proposed in the present invention can be more fully understood by reading the detailed description of the preferred embodiments. What needs to be concerned here is that the drawings are simplified schematic diagrams, and thus only constructs relevant to the present invention are illustrated. Also, these constructs are not drawn according to actual amounts, shapes and dimensions. Actually, the amount, shape and dimension are an optional design and the arrangements of the constructs may be very complex in the reality.

FIG. 3A to FIG. 3G are cross-sectional views of a method for fabricating conductive bumps of a circuit board according to the present invention.

Figure 1:
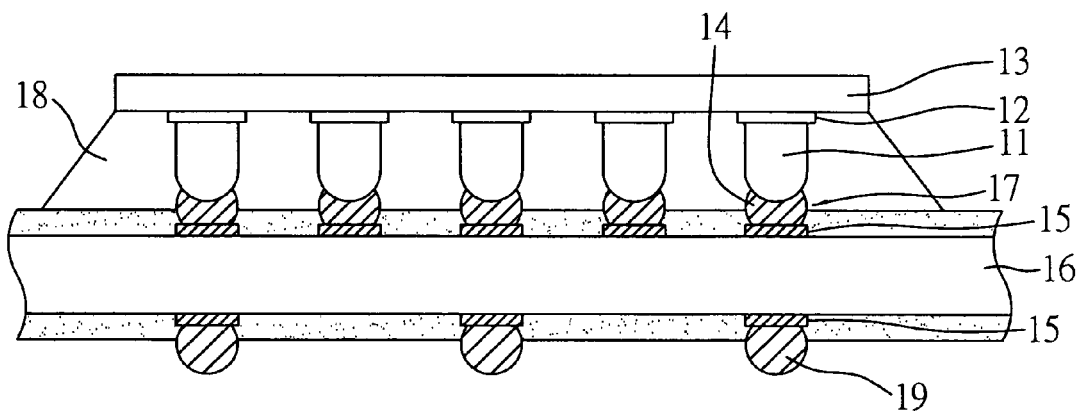
FIG. 1 (PRIOR ART) is a cross-sectional view of a conventional flip-chip semiconductor element.
Figure 2:
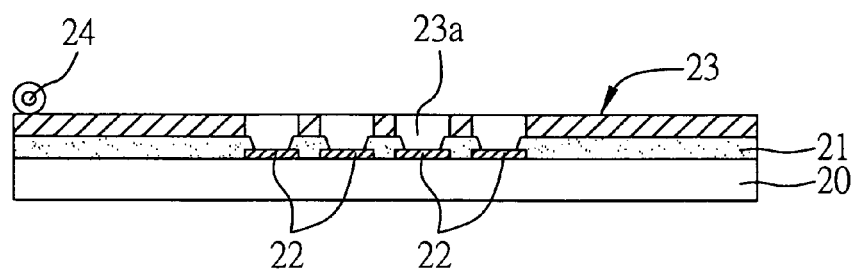
FIG. 2 (PRIOR ART) is a cross-sectional view of formation of a solder material on a conductive pad of a conventional circuit board using stencil printing technology known in the prior-art.
Figure 3A:
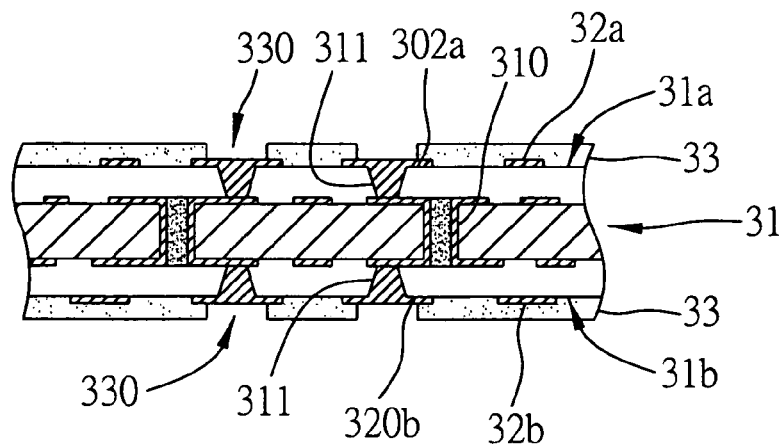
FIG. 3A to FIG. 3G are cross-sectional views of a method for fabricating conductive bumps of a circuit board according to the present invention.

Referring to FIG. 3A, first of all, a circuit board 31 having a first surface 31a and a corresponding second surface 31b is provided. A circuit structure 32a having a plurality of conductive pads 320a and a circuit structure 32b having a plurality of conductive pads 320b are respectively formed on the first surface 31a and the second surface 31b of the circuit board. The circuit structure 32a formed on the first surface 31a of the circuit board can be electrically connected to the circuit structure 32b formed on the second surface 31b of the circuit board by the means of conductive structures between neighboring layers such as a plated through hole 310 and a conductive via 311 formed penetrating through the circuit board 31. Also, an insulating layer 33 having a plurality of openings 330 penetrating therethrough is respectively formed on the first surface 31a and the second surface 31b of the circuit board 31 for exposing the conductive pads 320a and 320b. The insulating layer 33 can be made of a solder mask material such as a photoimagable polymer or organic insulating resin. The first surface 31a and the second surface 31b can be preferably a surface for mounting a chip or a solder ball. A four-layered circuit board 31 is used to provide description for the present invention with no intent to be limited by the invention. Thus, the circuit board 31 can be a double- or multi-layered circuit board. Moreover, the technique for fabricating the circuit board which is well known to those skilled in the art and not the technical feature of the present invention, and thus is not further described.

Figure 3B:
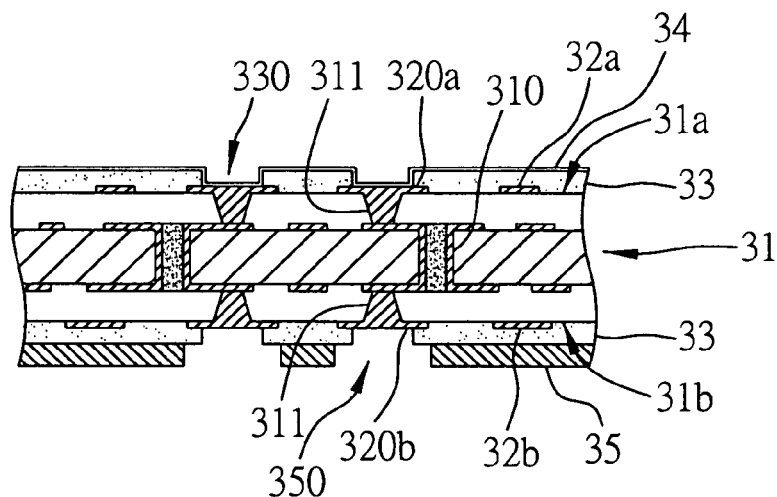

Referring to FIG. 3B, a conductive layer 34 is formed on a surface of the insulating layer 33 having the opening 330 on the first surface 31a of the circuit board 31. The conductive layer 34 mainly serves as a current conductive path for a subsequent electroplating process, and can be made of a general conductive metal selected from the group consisting of copper, tin, nickel, chromium, titanium, copper-chromium or tin-lead (multiple laminations), or alternatively, can be made of a electrically conductive polymer material selected from the group consisting of heterocycles or heteroaromatic compounds having conjugated bonds with single and double chains, such as polyacetylene, polypyrrole, polyaniline, organosulfur and organosulfide polymer.

Subsequently, a first resist layer 35 having a plurality of openings 350 penetrating therethrough is formed on the second surface 31b of the circuit board 31, such that the conductive pad 320b is exposed. The fist resist layer 35 can be a photoresist layer such as a dry film or a liquid photoresist, and can be formed on the second surface 31b of the circuit board 31 by printing, spin-coating or attaching techniques prior to be patterned to form the opening 350 by exposing and developing techniques. What needs to be concerned here is that the formation of the first resist layer 35 is an optional process. In other words, if a relatively lower height of conductive bumps need to be subsequently formed onto the conductive pads 320b by an electroplating process, the formation of the first resist layer 35 is unnecessary whereas if a relatively higher height of conductive bumps are subsequently required, the first resist layer 35 needs to be formed over the second surface 31b of the circuit board 320b.

Figure 3C:
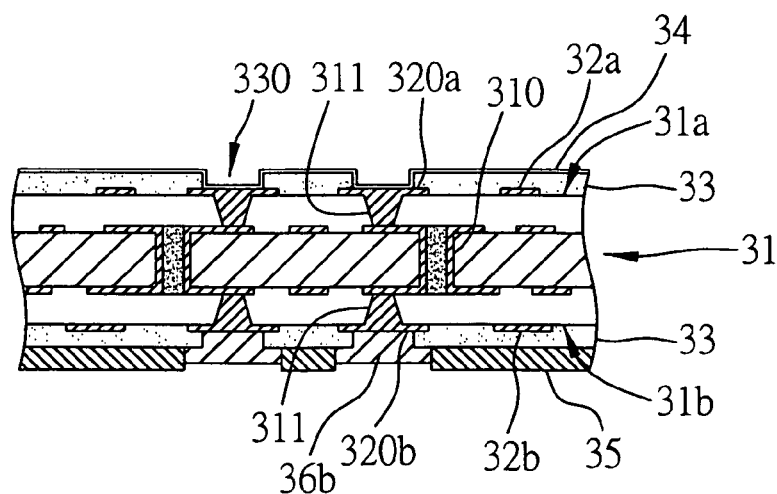

Referring to FIG. 3C, an electroplating process is performed via the conductive layer 34 formed on the first surface 31a of the circuit board 31 and the conductive structure (such as the plated through hole 310 and the conductive via 311) formed in the circuit board 31, such that a conductive bump 36b is formed on the conductive pad 320b located on the second surface 31b of the circuit board 31.

Figure 3D:
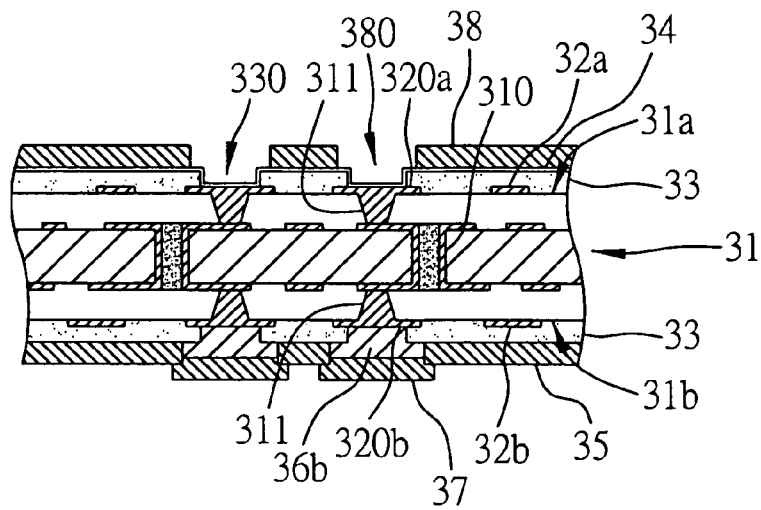

Referring to FIG. 3D, a second resist layer 37 is formed on the second surface 31b of the circuit board 31 to cover the conductive bump 36b, and a third resist layer 38 having an opening 380 corresponding to the location of the conductive pad 320a is formed on the first surface 31a of the circuit board 31. The second resist layer 37 can be formed as a complete layer on the second surface 31b of the circuit board 31 by printing, spin-coating or attaching techniques, or alternatively, can be partially formed on the second surface 31b of the circuit board 31 by stencil printing techniques, so as to cover the conductive bump 36b.

Figure 3E:
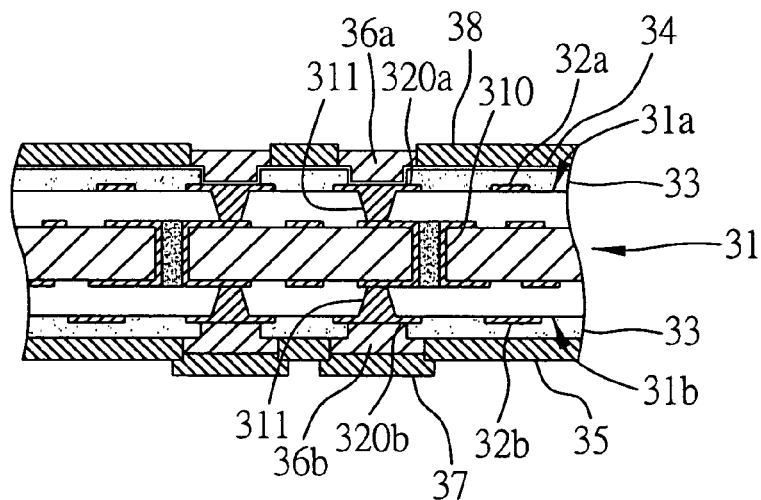

Referring to FIG. 3E, an electroplating process is performed on the circuit board 31, such that a conductive bump 36a is formed on the conductive pad 320a located on the first surface 31a of the circuit board 31 via the conductive layer 34.

Figure 3F:
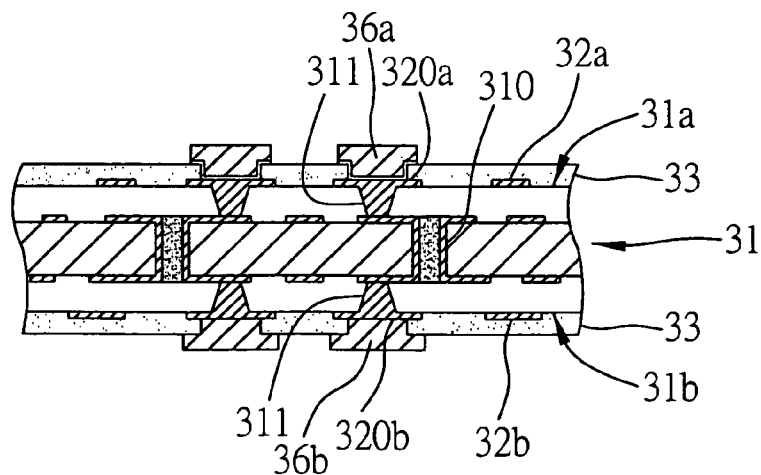
Figure 3G:
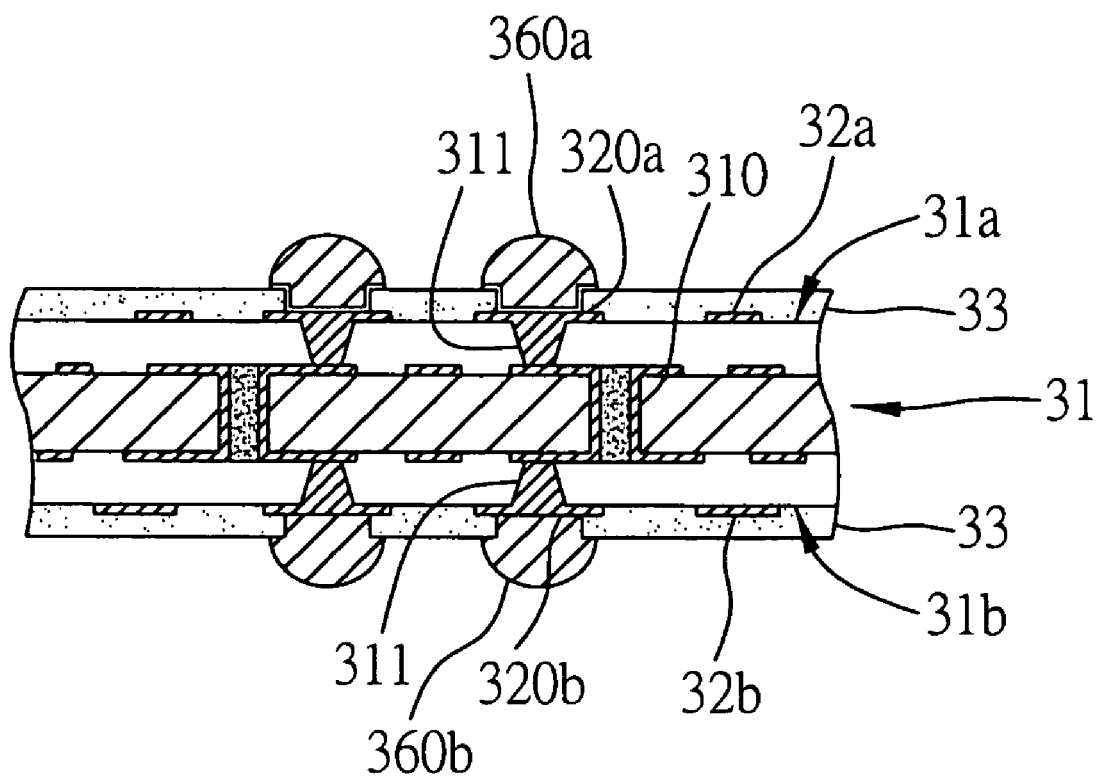

Referring to FIG. 3F, the first resist layer 35, the second resist layer 37, the third resist layer 38 and the conductive layer 34 covered by the third resist layer 38 are removed. If the conductive bumps 36a and 36b are made of solder materials, a reflow-soldering process can be subsequently performed, so that a pre-soldering bump 360a and a solder ball 360b can be respectively formed on the conductive pad 320a located on first surface 31a of the circuit board 31 and the conductive pad 320b located on the second surface 31b of the circuit board 31 (as shown in FIG. 3G). Alternatively, the conductive bumps 36a and 36b can be general conductive metal bumps, such that the conductive bumps 36a and 36b can serve as electrical signal input/output connections for the circuit board 31.

Moreover, what needs to be concerned here is that the conductive layer 34 is not limited to be formed on the first surface 31a of the circuit board 31, and can be optionally formed on the second surface 31b, such that the conductive bump 36a can be firstly formed on the conductive pad 320a located on the first surface 31a prior to form the conductive pad 36b on the conductive pad 320b located on the second surface 31b.

According to the foregoing method for fabricating the conductive bumps of the circuit board proposed in the present invention, the conductive layer is firstly formed on any surface of the circuit board. Then, the patterned resist layer is formed on the other surface of the circuit board, such that the conductive bump is formed on the conductive pad exposed from the patterned resist layer by an electroplating process via the conductive layer. Subsequently, another patterned resist layer is formed on the conductive layer, and the conductive bump is formed on the conductive pad covered by the conductive layer by an electroplating process. Therefore, the conductive bumps can be successively formed on the conductive pads located on different surfaces of the circuit board for electrically connecting an exterior. Furthermore, the present invention can employ an electroplating process in place of a prior-art printing method to form the conductive bump of the circuit board, so as to improve fabrication reliability.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating conductive bumps of a circuit board, comprising the steps of:

providing a circuit board having a first surface and a corresponding second surface, the first surface and the second surface being formed with circuit structures having a plurality of conductive pads, the circuit board being formed with conductive structures for electrically connecting the circuit structures formed on the first surface and the second surface, wherein the conductive structures between the two circuit structures are plated through holes and conductive vias, the circuit board being formed with an insulating layer having a plurality of openings penetrating therethrough to expose the plurality of conductive pad;

forming a conductive layer on a surface of the insulating layer having the opening on the first surface of the circuit board;

performing an electroplating process via the conductive layer formed on the first surface of the circuit board and the conductive structure formed in the circuit board, such that a conductive bump is formed on each of the conductive pads on the second surface of the circuit board;

forming a resist layer on the second surface of the circuit board for covering the conductive bump, and forming another resist layer on the first surface of the circuit board, wherein the another resist layer has a plurality of openings penetrating therethrough to expose the conductive pad; and performing an electroplating process on the circuit board to form a plurality of conductive bumps corresponding in position to the conductive pads on the first surface of the circuit board.

2. The method of claim 1, further comprising a step of:

forming a resist layer on the second surface of the circuit board before performing an electroplating process via the conductive layer formed on the first surface of the circuit board and the conductive structure formed in the circuit board to form a conductive bump on each of the conductive pads on the second surface of the circuit board, wherein the resist layer has a plurality of openings penetrating therethrough to expose the conductive pads.

3. The method of claim 1, further comprising a step of: removing the resist layer and the conductive layer covered by the resist layer.

4. The method of claim 1, wherein the insulating layer is made of a solder mask material.

5. The method of claim 1, wherein the conductive structures formed in the circuit board can be electrically connected to each other by the means of a plated through hole and a conductive via.

6. The method of claim 1, wherein the conductive layer is made of a material selected from the group consisting of a metal and an alloy.

7. The method of claim 1, wherein the conductive layer is made of a material selected from the group consisting of copper, tin, nickel, chromium, titanium, copper-chromium and tin-lead.

8. The method of claim 1, wherein the conductive layer is made of a material selected from the group consisting of heterocycles or heteroaromatic compounds having conjugated bonds with single and double chains.

9. The method of claim 1, wherein the conductive layer is selected from the group consisting of polyacetylene, polypyrrole, polyaniline and organosulfur and organosulfer polymer.

10. The method of claim 1, wherein the resist layer is a dry film or a liquid photoresist.

11. The method of claim 1, wherein the conductive bumps are a metal bump.

12. The method of claim 1, wherein the conductive bumps are made of a solder material.

13. The meThod of claim 12, wherein the solder material is provided in a reflow-soldering process to subsequently form a pre-soldering bump.

14. The method of claim 12, wherein the solder material is provided in a reflow-soldering process to subsequently form a solder ball.

15. The method of claim 1, wherein the first surface and the second surface are used for mounting a chip or solder ball.

* * * * *